Aug. 6, 1968 P. L. RICHMAN ET AL 3,396,347

PRECISION OSCILLATOR

Filed Jan. 18, 1967 2 Sheets-Sheet 1

INVENTORS
PETER L. RICHMAN
WALTER T. TOWNER
JOHN G. NORDAHL
BY Arnold & Roylance
ATTORNEYS

PRECISION OSCILLATOR

Filed Jan. 18, 1967 2 Sheets-Sheet 2

INVENTORS
PETER L. RICHMAN
WALTER T. TOWNER
JOHN G. NORDAHL
BY
Arnold & Roylance
ATTORNEYS

United States Patent Office 3,396,347
Patented Aug. 6, 1968

3,396,347

PRECISION OSCILLATOR

Peter L. Richman, Lexington, Walter T. Towner, Canton, and John G. Nordahl, Lexington, Mass., assignors to Weston Instruments, Inc., Newark, N.J., a corporation of Delaware Filed Jan. 18, 1967, Ser. No. 610,163
8 Claims. (Cl. 331—136)

ABSTRACT OF THE DISCLOSURE

A phase shift oscillator, including two integrator circuits and an inverter circuit connected in a closed loop with variable resistors for frequency adjustment in the integrator input circuits, is provided with an error correcting feed-forward circuit between the output of the first integrator and the input of the inverter. The error correcting circuit attenuates the forward-fed signal by varying the impedance to ground of a modulator. The modulator includes a plurality of diodes which are biased by a DC voltage derived from the oscillation output by a rectifier-integrator network.

This invention relates to oscillators, and more specifically to oscillator circuits having circuit means for controlling the amplitude of the oscillator output signal and for stabilizing the oscillator operation.

In the prior art it is well known to combine two integrator amplifier circuits and an inverting operational amplifier, all connected in series circuit relationship in a closed loop, to produce an apparatus which is capable of sustaining oscillation. In these prior art circuits each integrator circuit generally includes an amplifier having very high gain and a capacitor connected between the input and output terminals of the amplifier in the manner of an operational amplifier. Each integrator circuit is assumed to cause a 90° phase shift in the signal being amplified, the phase shift introduced by both amplifiers then being 180°. The inverting amplifier, which is generally an operational amplifier with resistive feedback, causes an additional 180° of phase shift. Thus when these three basic components are connected in a closed loop the total loop phase shift is 360° or 0° and oscillation is sustained.

The above discussion is based on the assumption that the theoretical 90° phase shift is attained in each integrator amplifier. However, a full 90° phase shift is obtained in a unity gain integrator when the open loop gain of the amplifier in the integrator in infinite. Obviously, no practical amplifier exhibits truly infinite gain. With an amplifier of high but finite gain the integrator exhibits a phase error (an amount by which the overall integrator phase shift differs from 90°) which is an inverse function of gain. For a more complete discussion of this aspect of integrators the reader is referred to the text Electronic Analog Computers, by Korn and Korn, second edition (1956), published by McGraw-Hill Book Company, New York, and especially to page 180, and the developmental material preceding that page.

A practical double integrator-inverter oscillator will always exhibit either slightly less than 360° phase shift as described above, or slightly more than 360° phase shift due to stabilization effects in a practical amplifier. As a result, unless a non-linear element of some kind is introduced into the system, the oscillator output will either degenerate or increase with time, and the output will either degenerate to zero, or else rise until it is limited, in a highly distorted manner, by the power supply.

It will be recognized that it may be desirable to use this basic oscillator circuit arrangement in a variable frequency oscillator by making the frequency determining elements in the circuit variable. In particular, it is frequently advantageous to insert variable resistors of either the rheostat or potentiometer type in the circuit means interconnecting the integrators and the inverter in the closed loop. The use of variable potentiometers, as opposed to rheostats or variable capacitors allows the control dial to be calibrated linearly, and permits circuit impedances to be low and virtually constant, even for low frequencies. This introduces an additional problem because the integrators and the inverter do not generally exhibit constant gain over the desired bandwidth. From the above discussion it will be recognized that if the gain of an amplifier changes the phase shift will also change. These disadvantages are especially undesirable when producing an oscillator of instrument quality wherein the desirable frequency range can be, for example, from approximately 10 Hz. to over .1 mHz. Within the selected range it is generally desirable to have a frequency response in the order of ±0.01%.

An object of the present invention is to provide a double integrator-inverter oscillator having means for controlling the overall phase shift of the oscillator loop.

A further object is to provide an oscillator in which the phase shift of the oscillation-sustaining feedback signal is closely controlled, thereby controlling the amplitude of the output signal.

A still further object is to provide a double integrator-inverter oscillator wherein a control signal is developed from an integrator output signal and is applied to the feedback network to modify the loop feedback phase shift and to hold constant the apparatus output signal.

Another object is to provide a double integrator-inverter oscillator having means for restricting the overall loop phase shift so that the amount by which it differs from 360° is always negative and is limited to a magnitude less than the maximum that can be supplied by a feed-forward phase-correcting signal.

Yet another object is to provide a variable frequency double integrator-inverter oscillator wherein a control signal is developed from an integrator output signal and is applied to the feedback network to modify the loop feedback phase shift and to hold constant the apparatus output signal regardless of variations in frequency over a predetermined relatively wide frequency range.

The invention includes a circuit for accepting the AC signal from the output of one of the integrator circuits in a double integrator-inverter oscillator, and circuit means for rectifying that AC signal and deriving therefrom a DC signal proportional in magnitude to the amplitude of the AC signal. The DC signal is referenced to a DC voltage of constant magnitude and is delivered as a control voltage to a linear modulator circuit. The modulator circuit presents an AC impedance to ground which is variable in accordance with the magnitude of the control voltage supplied thereto. That variable impedance to ground is connected in a circuit between the other integrator output and the inverter input and variation of the impedance alters the signal transfer across that circuit. The signal supplied to the inverter circuit through the modulator circuit differs, in phase from the signal supplied to the inverter circuit by the one integrator circuit, this phase difference being equal to the phase shift of that one integrator circuit. Combining these two signals tends to alter the loop phase shift to produce exactly 360° of loop phase shift.

In another aspect of the invention the feedback circuits of the integrators and inverter are provided with additional resistors and capacitors to shape the response so that the individual integrator and inverter phase shifts remain less than 90° and 180°, respectively, resulting in a phase error signal which is consistently of one polarity and avoiding large or shifting correction signals which could introduce distortion.

In order that the manner in which the foregoing and other objects are attained in accordance with the invention can be understood in detail, particularly advantageous embodiments thereof will be described with reference to the accompanying drawings, which form a part of this specification and wherein.

Figure 2:
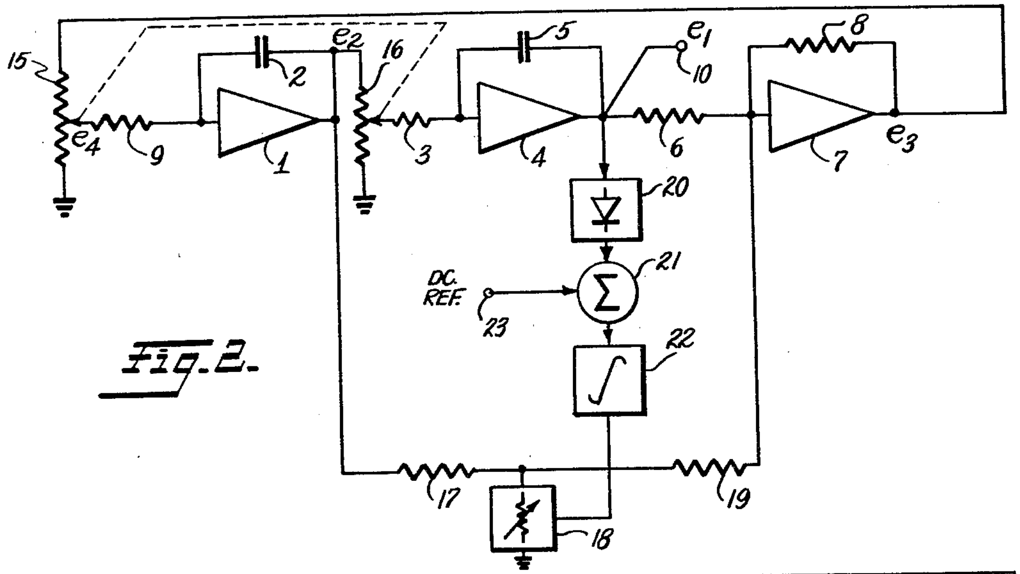
FIG. 2 is a schematic diagram, partly in block form, of one embodiment of an oscillator incorporating the invention.
Figure 3:
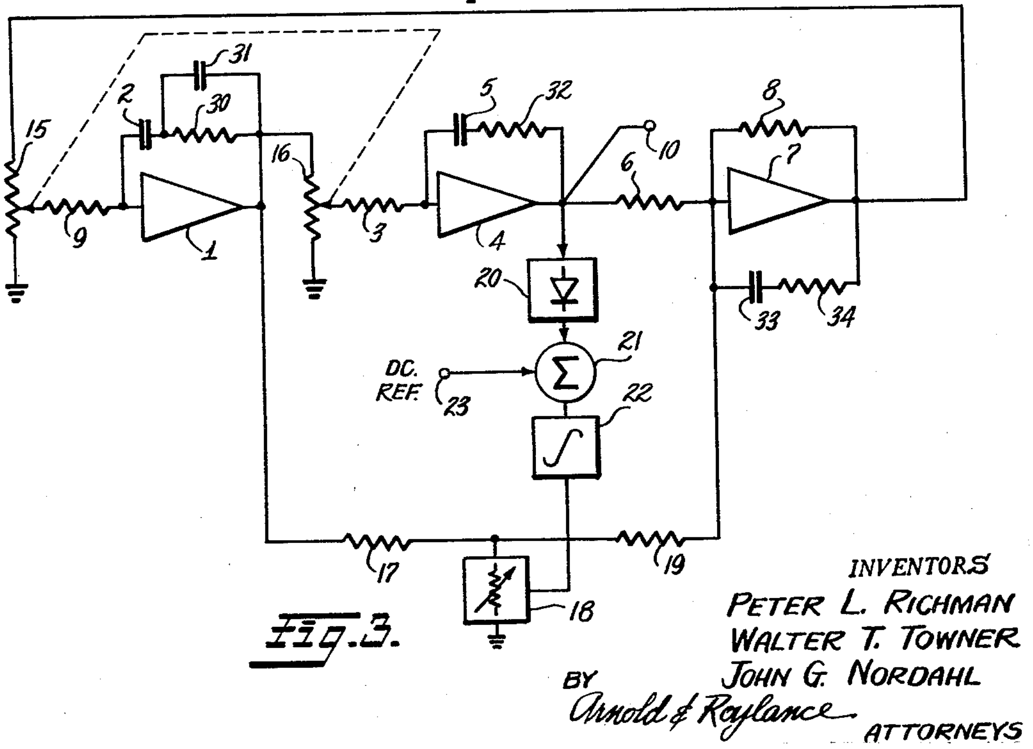
FIG. 3 is a schematic diagram, partly in block form, of a second embodiment of an oscillator apparatus incorporating the invention.
Figure 4:
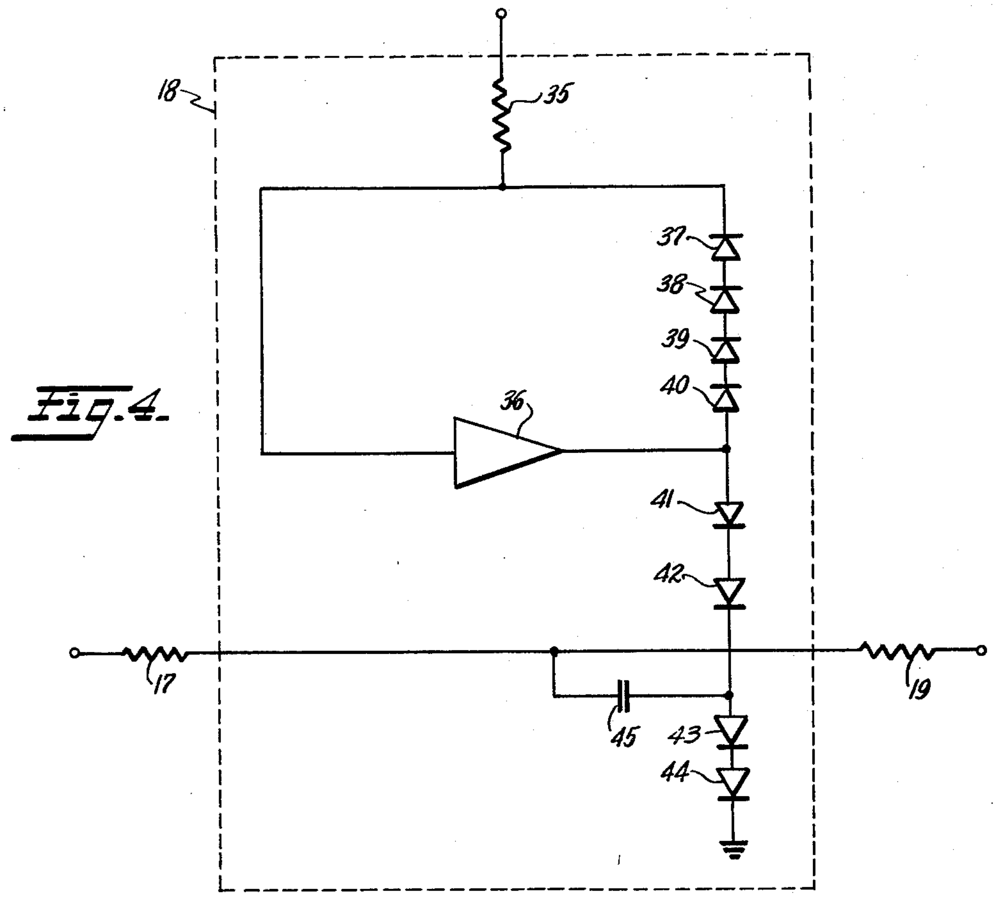
Figure 5:
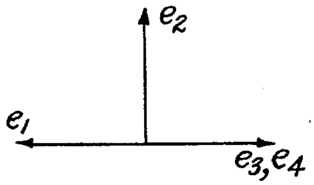
Figure 6:
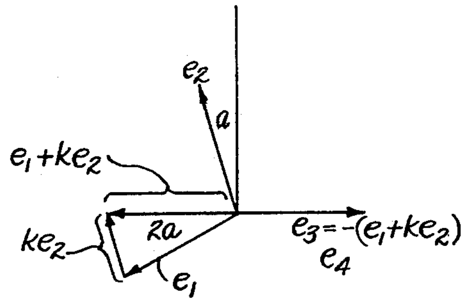

FIG. 4 is a schematic diagram, partly in block form, of a modulator circuit useable in the embodiments of FIGS. 2 and 3; and FIGS. 5 and 6 are vector diagrams useful in explaining the operation of the embodiments of FIGS. 2 and 3.

Figure 1:
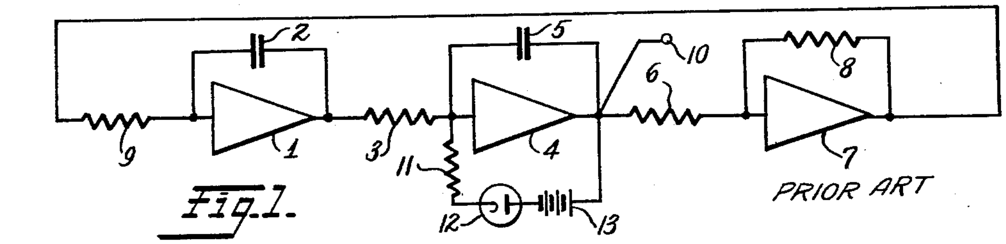
FIG. 1 is a schematic diagram, partly in block form, of a prior art oscillator.

In the prior art oscillator shown in FIG. 1, a conventional high gain amplifier 1 is provided with a capacitor 2, the capacitor being connected between the input and output terminals of amplifier 1 to form an integrator circuit. The output terminal of amplifier 1 is connected to one terminal of an input resistor 3, the other terminal of which is connected to the input terminal of a conventional high gain amplifier 4. Amplifier 4 is also provided with a capacitor 5 which is connected between the input and output terminals of amplifier 4. The output terminal of amplifier 4 is connected to one terminal of an input resistor 6 the other terminal of which is connected to the input terminal of a conventional high gain amplifier 7. An oscillator output terminal 10 is advantageously connected to the output of amplifier 4. A resistor 8 is connected between the input and output terminals of amplifier 7 to form a conventional operational inverting amplifier circuit. The output terminal of amplifier 7 is connected to one terminal of an input resistor 9, the other terminal of which is connected to the input terminal of amplifier 1.

It will be seen that the circuit of FIG. 1 shows a conventional double integrator-inverter oscillator, also referred to as a dual-integrator phase-shift oscillator, wherein the integrator including amplifier 1 ideally provides a 90° phase shift because of the action of feedback capacitor 2 and input resistor 9; the integrator circuit including amplifier 4 similarly provides a 90° phase shift; and the inverter circuit including amplifier 7 provides 180° of phase shift. In practice, the integrators and inverters must be designed so that an excess of phase shift will be exhibited by one of them in order to sustain oscillations. Having introduced this excess it is then necessary to limit the buildup to prevent an uncontrolled runaway condition. One such circuit is shown in FIG. 1 in which a limiter circuit is connected in parallel circuit relationship with the integrator including amplifier 4 and capacitor 5, the limiter including a resistor 11, a diode 12, and a bias battery 13 connected in series circuit relationship. This circuit is similar to that shown and described in U.S. Patent No. 3,177,347, Cowley. In this approach, oscillations can be maintained in a stable fashion but only at the cost of substantial distortion. The sum of the phase shifts is therefore equal to 360°, the signal appearing at the output of amplifier 7 and conducted through input resistor 9 to the input of amplifier 1 therefore reinforces the signal originally appearing at the input of amplifier 1, and oscillation is sustained. As will be recognized by one skilled in the art, the frequency determining elements in the circuit are resistors 3 and 9 and capacitors 2 and 5. To form a variable oscillator from the circuit of FIG. 1 it is sufficient to replace fixed resistors 3 and 9 with variable resistors. However, the frequency of stable loop oscillation occurs where loop gain equals unity. Integrator gain is $$1/WRC$$

where R is the input resistor, C is the feedback capacitor and W is angular frequency $2\pi f$. Hence, loop gain is proportional to $$[1/WRC]^2$$

and is equal to $$K[1/WRC]^2$$

where K is equal to the inverter gain. The frequency $W_o$ at which the oscillator will operate can be obtained by solving for unit loop gain, i.e., set $$K[1/W_oRC]^2=1$$

and solve to obtain $$W_o=\sqrt{K}/RC$$

The variation of frequency as a function of resistance is unfortunate because with linear rheostats used for R to obtain frequency variation, dial calibrations at the high frequency (and low resistance) end are severely compressed.

In FIG. 2 a preferable system is shown employing potentiometers instead of rheostats for frequency variation and also provided with a network to compensate for the phase shift variation. As in FIG. 1, amplifiers 1, 4 and 7 are interconnected by input resistors 9, 3, and 6, respectively, and are provided with feedback capacitors 2 and 5 and feedback resistor 8, an output terminal 10 being connected at an appropriate point in the loop such as the output terminal of amplifier 4. In addition, a potentiometer 15 is connected between the output terminal of amplifier 7 and input resistor 9, the fixed terminals of potentiometer 15 being connected to the output terminal of amplifier 7 and to ground, and the movable element being connected to resistor 9. Also, a potentiometer 16 is connected between the integrator circuits including amplifiers 1 and 4, the fixed terminals of potentiometer 16 being connected to the output terminal of amplifier 1 and ground and the movable wiper being connected to resistor 3. The movable wipers of potentiometers 15 and 16 are generally mechanically coupled together so that the characteristics of the two integrator circuits will be changed in the same direction and by the same amount when a frequency adjustment is made.

The gain variation obtained by using potentiometers as shown in FIG. 2 instead of rheostats results in a linear dial vs. frequency relationship for potentiometers with linear taper.

The phase and amplitude controlling network of the circuit of FIG. 2 includes a fixed resistor 17 one terminal of which is connected to the output terminal of amplifier 1 and the other terminal of which is connected to a linear modulator circuit 18. A fixed resistor 19 is connected between the same point at modulator 18 and the input terminal of an amplifier 7. Modulator 18 provides a variable AC impedance to ground in the feedback circuit including resistors 17 and 19, the magnitude of the impedance being controlled by a DC control signal.

The control signal is developed by a circuit including a rectifier 20, a summing circuit 21 and an integrator circuit 22, these components being connected to series circuit relationship between the output terminal of amplifier 4 and a control signal input terminal of modulator 18. A DC reference voltage is connected to a terminal 23 which is also connected to summing circuit 21. The source of reference voltage can be any well regulated supply such as a Zener diode-clamped, well filtered circuit. It should also be noted that the source connected to terminal 23 can be a variable voltage source, in which case the apparatus described herein would constitute a modulated oscillator.

In explaining the circuit of FIG. 2, it will be convenient to refer to the voltages appearing at various points in that circuit identified as follows. The voltage appearing at the output of amplifier 1 will be referred to as $e_2$, the voltage appearing at output terminal 10 will be referred to as $e_1$, and the voltage appearing at the output terminal of amplifier 7 will be referred to as $e_3$. Then, $e_4$ is the voltage appearing at the input to amplifier 1, this voltage clearly being in phase with $e_3$.

Referring now to the vector diagrams in FIGS. 5 and 6, it will be seen that FIG. 5 illustrates the ideal condition present in the circuit of FIG. 1 when amplifiers 1, 4, and 7 are infinite gain amplifiers. With modulator 18 and with amplifiers of finite gain the phase relationship in FIG. 2 can approximate that of FIG. 6 wherein the voltage vector for $e_1$ leads the vector for $e_2$ by more than 90°. Also, $e_3$ than lags $e_1$ by less than 180° and the loop phase shift would no longer be equal to 360°. It will be recognized that the lag angles in FIG. 6 are somewhat exaggerated for illustration. The circuit including resistors 17 and 19 and modulator 18 add to voltage $e_1$ a voltage parallel with $e_2$ but diminished by a factor $k$ determined by modulator 18. This vectorial addition results in a voltage $e_1+ke_2$ as shown in FIG. 6. This summation of $e_1$, with $ke_2$ is carried out by amplifier 7 and results in an output $e_3$ from amplifier 7, $e_3$ being in phase with $e_4$. The final vector diagram becomes equivalent to that shown in FIG. 5. With the phase shifts as shown in FIG. 5, the loop gain is unity, at the operating frequency, with a total shift of 360° so that oscillation is continuously sustained.

A further embodiment is shown in FIG. 3, in which the elements of FIG. 2 are identified by the same reference numerals and need not be further discussed. In addition to those elements, a resistor 30 is connected in serious relationship with capacitor 2 in the feedback circuit for amplifier 1, and a capacitor 31 is connected in parallel circuit relationship with resistor 30.

In the feedback circuit for amplifier 4 a resistor 32 is connected in series circuit relationship with capacitor 5. A series circuit including a capacitor 33 and a resistor 34 are connected as an additional feedback circuit in parallel with amplifier 7.

Resistors 30, 32 and 34 and capacitors 31 and 33 are added to shape the responses of the individual integrator and inverter circuits to maintain small phase errors which always are lagging errors. If at some frequency the phase shift of one of the stages were to become greater than its normal shift (90° or 180°), the correction signal furnished by the modulator circuit from amplifier 1 to amplifier 7 would have to change its polarity and/or become very large. Either condition would introduce distortion. The phase shift of each stage is therefore intentionally maintained at less than the full 90° or 180° to retain small, lagging errors.

FIG. 4 shows a more detailed schematic diagram of a modulator circuit 18 which can advantageously be used in the embodiments shown in FIGS. 2 and 3. In FIG. 4, one terminal of a fixed resistor 35 is connected to the output of integrator circuit 22 and acts as the control voltage input terminal for modulator 18. The other terminal of resistor 35 is connected to the input terminal of a conventional high gain amplifier 36 and to the anode electrode of a conventional semiconductor diode 37. Diode 37 is connected in series circuit relationship with similar semiconductor diodes 38, 39, and 40, the anode of diode 40 being connected to the output terminal of amplifier 36 and to the anode of a conventional semiconductor diode 41. Diodes 37–40 constitute a nonlinear feedback circuit for amplifier 36.

Diode 41 is connected in series circuit relationship with similar conventional semiconductor diodes 42, 43 and 44, the cathode electrode of diode 44 being connected to a point of reference potential such as ground as shown in FIG. 4. The midpoint of the series circuit including diodes 41–44, i.e., the junction of the cathode electrode of diode 42 and the anode electrode of diode 43, is connected to one terminal of a capacitor 45, the other terminal of which is connected to the junction between resistors 17 and 19, previously discussed, which are connected in series circuit relationship between the output terminal of amplifier 1 and the input terminal of amplifier 7. Capacitor 45 acts as a coupling or DC blocking capacitor.

To understand the operation of the circuit of FIG. 4 resistor 35 is best viewed as an input resistor to an operational amplifier having a nonlinear feedback circuit including the plurality of diodes 37–40. A control voltage appearing at the output of integrator 22 creates a current flow through resistor 35 to the input of amplifier 36. The input terminal of amplifier 36, because of the high gain of the amplifier, rests substantially at ground potential. The amplifier then provides sufficient current flow through the diode feedback circuit to produce a current flow therein equal to the current produced in resistor 35. The voltage at the output terminal of amplifier 36 then produces a like current flow through the series circuit including the diodes 41–44 to ground. Thus the current flow through the junction between diodes 42 and 43 is a direct function of the current flow through resistor 35 and, hence, of the control voltage produced by integrator 22. As is well known, the reverse resistance of a diode is an inverse function of the current supplied thereto. Thus, the diode resistance between the junction of diodes 42 and 43 and ground is likewise a function of the control voltage. This variable resistance under the control of the voltage from integrator 21 is coupled to the amplifiers by the circuit including resistors 17 and 19 and capacitor 45 and acts to attenuate the voltage from amplifier 7 providing the attenuation of voltage $e_2$ as explained with reference to FIG. 6.

While certain advantageous embodiments have been chosen to illustrate the invention, it will be understood by those skilled in the art that various changes and modifications can be made therein without departing from the scope of the invention as defined in the appended claims.

What is claimed is:

1. An oscillator apparatus comprising the combination of first, second and third amplifier circuit means for shifting the phase of electrical signals applied thereto, said amplifier circuit means being connected in series circuit relationship in a closed loop, the total of the phase shifts provided by said amplifier circuit means being approximately equal to 360 electrical degrees; and variable impedance circuit means connected between the output of said first amplifier circuit means and the input of said third amplifier circuit means for combining at said input the output signal from said second amplifier circuit means and a portion of the output signal from said first amplifier circuit means, said signals being separated in phase by the phase shift of said second amplifier circuit means, whereby the loop phase shift is held to 360° and the amplitude of the signal produced is held constant, said variable impedance circuit means comprising a control terminal; circuit means connected between the output of said second amplifier circuit means and said control terminal for deriving a control signal proportional to the amplitude of the output signal from said second amplifier circuit means; and means responsive to said control signal to provide a variable impedance proportional to the magnitude of said control signal.

2. In an apparatus for generating electrical oscillations of frequencies within a predetermined relatively wide range of a type including two electronic integrator amplifier circuits and an inverter amplifier circuit connected in a closed loop series circuit, the improvement comprising the combination of a resistor; modulator circuit means connected in series circuit relationship with said resistor between the output of one of said integrator amplifier circuits and the input of said inverter amplifier circuit for providing to said inverter amplifier circuit a portion of the output signal from said one integrator amplifier circuit, said modulator circuit means having a control terminal, said modulator circuit means having a variable impedance therein the magnitude of which is controllable by a DC control voltage applied to said control terminal; and circuit means for deriving a DC control voltage from the AC oscillations generated by said apparatus, the magnitude of said DC control voltage being proportional to the amplitude of said oscillations.

3. An apparatus according to claim 2 and further comprising a first variable resistor interconnecting said two electronic integrator amplifier circuits in said closed loop; and a second variable resistor interconnecting said inverter amplifier circuit and said one of said integrator amplifier circuits, said first and second variable resistors each having a movable element, said movable elements being mechanically interconnected to move together.

4. Apparatus according to claim 2 wherein said circuit means for deriving said DC control voltage comprises a source of DC reference voltage; rectifier circuit means connected to the output of the other one of said two electronic integrator amplifier circuits for rendering the output signal unidirectional; summing circuit means connected to said source of reference voltage and said rectifier circuit means for referring the unidirectional signal to said reference; and integrator circuit means for modifying the output of said summing circuit means to produce a DC control voltage, the output of said integrator circuit means being connected to said control terminal of said modulator circuit means.

5. Apparatus according to claim 2 wherein said modulator circuit means comprises a high gain amplifier having an input terminal and an output terminal; a diode feedback circuit comprising an even number of diodes connected in series circuit relationship between said input and output terminals of said amplifier, all of said diodes being poled in the same direction; a plurality of diodes, equal in number to the number of diodes in said diode feedback circuit, connected in series circuit relationship between said output terminal of said amplifier and a point of reference potential, all of the diodes in said plurality being poled in the same direction; an input resistor interconnecting said control terminal and said input terminal of said amplifier; and circuit means coupling the midpoint of the circuit including said plurality of diodes to said resistor between the output of said one of said integrator amplifier circuits and the input of said inverter amplifier circuit.

6. A controlled amplitude, stable, phase shift oscillator apparatus comprising the combination of two integrator circuits each comprising a high gain amplifier having an input terminal and an output terminal, and a feedback circuit connected between said input and output terminals of said amplifier, said feedback circuit including a resistor and a capacitor connected in series circuit relationship, one of said two integrator circuits further comprising a capacitor connected in parallel circuit relationship with said resistor in said feedback circuit; a first variable resistor connected between said output terminal of said one of said integrator circuit amplifiers and the input terminal of the other of said integrator circuit amplifiers; an inverter circuit comprising a high gain amplifier having an input terminal and an output terminal, a feedback circuit including a resistor and a capacitor connected in series circuit relationship between said input and output terminals of said inverter circuit amplifier, and an additional resistor connected in parallel circuit relationship with said feedback circuit; an input resistor connected between said input terminal of said inverter circuit amplifier and the output terminal of said other of said integrator circuit amplifiers; a second variable resistor connected between said output terminal of said inverter circuit amplifier and said input terminal of said one of said integrator circuit amplifiers; a forward-feed circuit including at least one resistor connected between said output terminal of said one of said integrator circuit amplifiers and said input terminal of said inverter circuit amplifier; voltage variable impedance circuit means connected between said forward-feed circuit and a point of reference potential; and means for deriving a DC control voltage proportional in magnitude to the oscillator output and for applying said control voltage to said voltage variable impedance.

7. Apparatus according to claim 6 wherein said voltage variable impedance comprises a plurality of semiconductor diodes connected in series circuit relationship, all of said diodes being poled in the same direction.

8. An oscillator apparatus comprising the combination of first, second and third amplifier circuit means for shifting the phase of electrical signals applied thereto, said amplifier circuit means being connected in series circuit relationship in a closed loop, the total of the phase shifts provided by said amplifier circuit means being approximately equal to 360 electrical degrees; resistor circuit means connected between the output of said first amplifier circuit means and the input of said third circuit means; and variable impedance circuit means connected between said resistor circuit means and ground for combining at said input the output signal from said second amplifier circuit means and a portion of the output signal from said first amplifier circuit means, said signals being separated in phase by the phase shift of said second amplifier circuit means, whereby the loop phase shift is held to 360° and the amplitude of the signal produced is held constant, said variable impedance circuit means comprising a control terminal; circuit means connected between the output of said second amplifier circuit means and said control terminal for deriving a control signal proportional to the amplitude of the output signal from said second amplifier circuit means; and means responsive to said control signal to provide a variable impedance proportional to the magnitude of said control signal.

References Cited

UNITED STATES PATENTS 3,137,825 6/1964 Haner ---------- 331—135 X

FOREIGN PATENTS 1,032,796 6/1958 Germany.

OTHER REFERENCES

E. F. Good: "A Two-Phase Low-Frequency Oscillator," Electronic Engineering, May 1957, pp. 210–213.

ROY LAKE, *Primary Examiner*.

S. H. GRIMM, *Assistant Examiner*.

Disclaimer and Dedication 3,396,347.—*Peter L. Richman*, Lexington, *Walter T. Towner*, Canton, and *John G. Nordahl*, Lexington, Mass. PRECISION OSCILLATOR. Patent dated Aug. 6, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]